US012751257B2

(12) United States Patent
Lu et al.

(10) Patent No.: US 12,751,257 B2

(45) Date of Patent: Sep. 29, 2026

(54) FIN STRUCTURES

(71) Applicant: Taiwan Semiconductor Manufacturing Company, Ltd., Hsinchu (TW)

(72) Inventors: Chun-Yang Lu, Taoyuan (TW); Tz-Shian Chen, Taoyuan (TW); Li-Ting Wang, Hsinchu (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1063 days.

(21) Appl. No.: 17/807,324

(22) Filed: Jun. 16, 2022

(65) Prior Publication Data

US 2023/0411168 A1 Dec. 21, 2023

(51) Int. Cl.

*H10P 95/90* (2026.01)
*H10D 62/10* (2025.01)
*H10P 14/60* (2026.01)
*H10P 14/692* (2026.01)

(52) U.S. Cl.

CPC ........... *H10P 95/90* (2026.01); *H10D 62/117* (2025.01); *H10P 14/6308* (2026.01); *H10P 14/69215* (2026.01)

(58) Field of Classification Search

CPC ............. H01L 21/324; H01L 21/02164; H01L 21/02236; H10D 62/117; H10D 30/62; H10D 30/024; H10D 30/751

See application file for complete search history.

(56) References Cited

U.S. PATENT DOCUMENTS

| | | | | |
|---|---|---|---|---|
| 8,211,772 | B2 | 7/2012 | Kavalieros et al. | |
| 9,773,875 | B1 * | 9/2017 | Jagannathan ........ | H10D 30/751 |
| 11,282,942 | B2 | 3/2022 | Kao et al. | |
| 2011/0275226 | A1 * | 11/2011 | Landru ................ | H10P 95/906 257/E21.24 |
| 2013/0043512 | A1 * | 2/2013 | Huang ................ | H10D 30/024 257/E21.24 |
| 2016/0093692 | A1 | 3/2016 | Xie et al. | |
| 2017/0077286 | A1 * | 3/2017 | Lo ........................ | H10D 30/024 |
| 2018/0026101 | A1 * | 1/2018 | Jagannathan .......... | H10D 30/62 257/401 |

(Continued)

FOREIGN PATENT DOCUMENTS

| | | | | |
|---|---|---|---|---|
| CN | 112447596 A | | 3/2021 | |
| CN | 112928163 A | * | 6/2021 | ........... H10D 30/024 |
| TW | 202111954 A | | 3/2021 | |

OTHER PUBLICATIONS

Translation of Cheng et al. (CN 112928163 A) (Year: 2021).*

*Primary Examiner* — Jacob Y Choi
*Assistant Examiner* — Ashley Nicole Blackwell
(74) *Attorney, Agent, or Firm* — Ingrassia Fisher & Lorenz, LLP | IF&L

(57) ABSTRACT

Provided is a device including a fin structure and methods for forming such a device. A method includes forming an initial fin having a sidewall. Further, the method includes forming an additional layer of fin material over the sidewall, wherein the additional layer has a thickness. Also, the method includes adjusting the thickness of the additional layer of fin material to form a fin structure with a desired critical dimension.

18 Claims, 8 Drawing Sheets

(56) References Cited

U.S. PATENT DOCUMENTS

| | | | | |
|---|---|---|---|---|
| 2019/0067283 | A1* | 2/2019 | Wang | H10D 84/853 |
| 2019/0341312 | A1* | 11/2019 | Huang | H01L 21/0228 |
| 2021/0225839 | A1 | 7/2021 | Lin et al. | |

* cited by examiner

FIN STRUCTURES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

Figure 1:
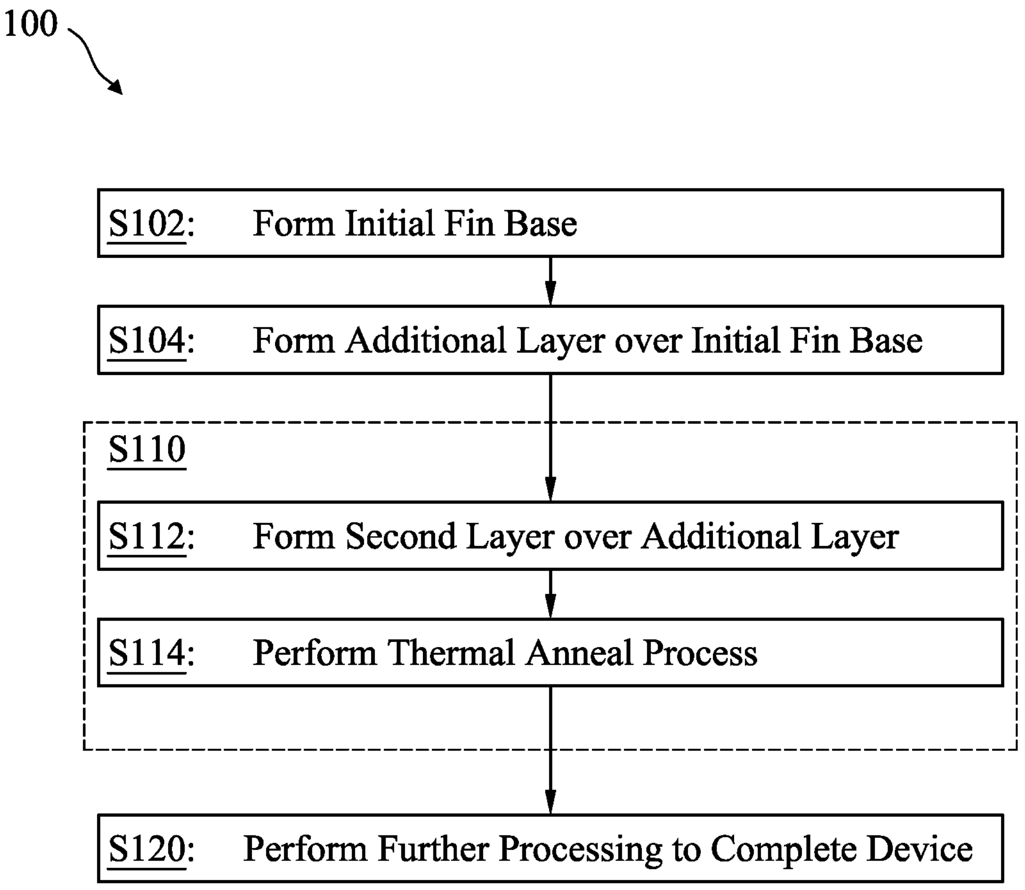
FIG. 1 is a flow chart illustrating a method for forming a device including a fin structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

As used herein, a "material layer" is a layer that includes at least 50 wt. % of the identified material, for example at least 60 wt. % of the identified material, such as at least 75 wt. % of the identified material or at least 90 wt. % of the identified material depending on the embodiment. Likewise, a layer that is a "material" includes at least 50 wt. % of the identified material, for example at least 60 wt. % of the identified material, such as at least 75 wt. % of the identified material, or at least 90 wt. % of the identified material depending on the embodiment. For example, each of a silicon germanium layer and a layer that is silicon germanium is a layer that is at least 50 wt. %, at least 60 wt. %, at least 75 wt. %, or at least 90 wt. % silicon germanium depending on the embodiment.

In addition, the present disclosure may repeat reference numerals and/or letters in the various examples. This repetition is for the purpose of simplicity and clarity and does not in itself dictate a relationship between the various embodiments and/or configurations discussed.

Various embodiments are discussed herein in a particular context, namely, for forming a fin-like field-effect transistor (FinFET) device.

The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments. It is understood, however, that the application should not be limited to a particular type of device, except as specifically claimed. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

Various embodiments provide a semiconductor device and methods of forming a semiconductor device. In certain embodiments, an element is provided with a desired critical dimension by first etching a material or materials to form an initial foundation or base member, then forming an additional layer of material over the initial base member; and then adjusting the thickness of the additional layer such that the element has the desired critical dimension.

In exemplary embodiments, the element is a semiconductor fin structure, the base members is formed from a layer of a semiconductor material or from layers of semiconductor materials, and the additional layer is a semiconductor material. For example, the base member may be formed from silicon or from silicon and silicon germanium, and the additional layer may be silicon.

In exemplary embodiments, the thickness of the additional layer of material is adjusted by depositing a second layer over the additional layer and by thermally treating the structure to cause the thickness of the additional layer to reduced, at least in some regions. For example, during thermal treatment, portions of the additional layer may be consumed at the interface with the second layer. The amount of additional layer consumed may be controlled by the process duration or other process choices. For example, different thicknesses of the second layer may be selectively formed over different locations of the additional layer to control the amount of additional layer consumed in those locations.

In exemplary embodiments, the second layer is an oxide, such as silicon oxide, and oxygen radicals consume portions of the additional layer at the interface between the additional layer and the second layer.

Further, it is contemplated that the process for adjusting the thickness of the additional layer may provide other benefits or results. First, consumption of the additional layer at the interface with the second layer causes an increase in the thickness of the second layer. A greater increase in thickness of thin regions of the second layer, as compared to thick regions of the second layer, results in greater conformality of the second layer, and reduced loading. Second, sub-oxide may be present in the additional layer or second layer, such as at the interface between the additional layer and second layer. The thermal process may repair the sub-oxide, such as by oxygen radical repair. Third, the second layer may be formed with a porous structure. The thermal treatment may reduce the porosity of the structure and improve density, such as through densification. For example, the thermal treatment may be performed with a gas composition including nitrogen and nitridation may reduce the porosity of the structure of the second layer.

While the Figures illustrate various embodiments of a semiconductor device, additional features may be added in the semiconductor device depicted in the Figures and some of the features described below can be replaced, modified, or eliminated in other embodiments of the semiconductor device.

Referring now to the Figures, FIG. 1 illustrates a flow chart of a method 100 for forming a structure, such as a FinFET transistor, according to various aspects of the present disclosure. FIG. 1 is described in conjunction with FIGS. 2-12 which illustrate a semiconductor device or structure 200 at various stages of fabrication in accordance with some embodiments of the present disclosure of the method 100. The method 100 is merely an example, and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device depicted in the Figures and some of the features described below can be replaced, modified, or eliminated in other embodiments of the semiconductor device.

As with the other method embodiments and exemplary devices discussed herein, it is understood that parts of the semiconductor device 200 may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PPETs, NFETs, etc., which may be interconnected. Moreover, it is noted that the process steps of method 100, including any descriptions given with reference to the Figures, as with the remainder of the method and exemplary figures provided in this disclosure, are merely exemplary and are not intended to be limiting beyond what is specifically recited in the claims that follow.

At operation S102, the method 100 (FIG. 1) forms initial fins or fin bases. Cross-referencing FIG. 1 with FIG. 2, it may be seen that operation S102 may include receiving a semiconductor structure or workpiece 200. As shown, semiconductor structure 200 includes a substrate 202, such as a silicon substrate. The substrate 202 may alternatively or additionally include an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); or combinations thereof.

The substrate 202 may be uniform in composition or may include various layers. The layers may have similar or different compositions, and in various embodiments, some substrate layers have non-uniform compositions to induce device strain and thereby tune device performance Examples of layered substrates include silicon-on-insulator (SOI) substrates 202. In some such examples, the substrate 202 may include an embedded insulating layer such as a silicon oxide, a silicon nitride, a silicon oxynitride, or other suitable insulating materials.

The received semiconductor structure 200 may have one or more layers formed upon it. For example, the substrate 202 may include one or more semiconductor layers epitaxially grown on bulk silicon, such as a silicon wafer. For example, the substrate 202 may include a first semiconductor layer and a second semiconductor layer formed on the first semiconductor layer. The first semiconductor layer includes a first semiconductor material (such as Si) and the second semiconductor layer includes a second semiconductor material (such as SiGe) different from the first semiconductor material. The second semiconductor layer may be epitaxially grown by suitable techniques, such as selective epitaxy growth (SEG). In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

Various doping process may be applied to the substrate 202 through a proper method, such as ion implantation. In the present embodiment, an anti-punch-through (APT) process is applied to the substrate 202 to introduce proper dopants to respective regions of the substrate through ion implantations. The APT process may include forming a hard mask with openings defining regions for nFETs; performing an ion implantation to the nBET regions; and removing the hard mask, and similar steps for pFETs.

Figure 2:
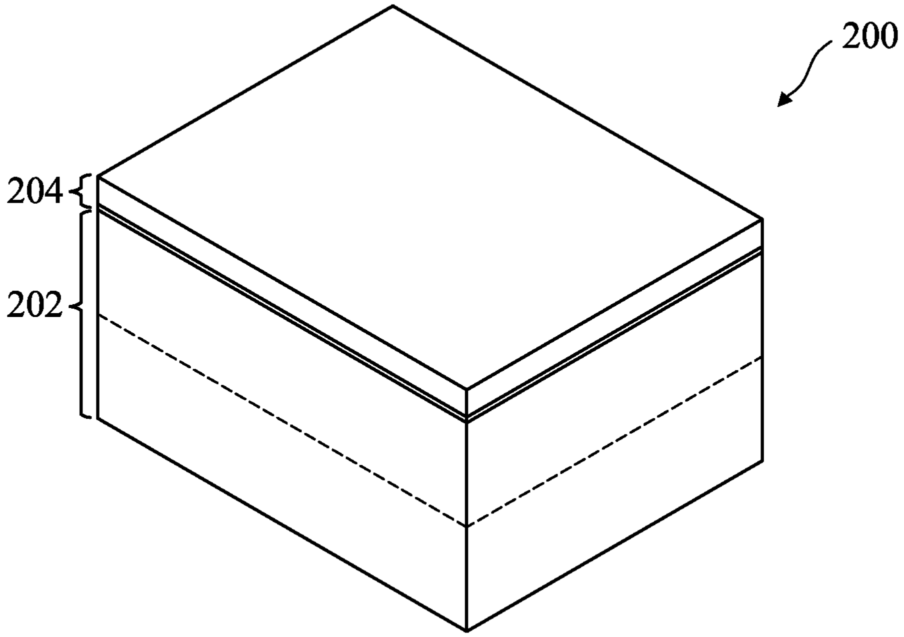
FIG. 2 is a perspective view of a semiconductor structure, constructed in accordance with some embodiments.

As shown in FIG. 2, to facilitate fabrication and to avoid damage to the semiconductor layer, one or more hard mask layers 204 may be formed on the substrate 202. An exemplary hard mask layer 204 includes a dielectric such as semiconductor oxide, semiconductor nitride, semiconductor oxynitride, or semiconductor carbide. In some examples, the hard mask layer 204 includes two or more films stacked together, such as a silicon oxide film and a silicon nitride film in stack. The hard mask layer 204 may be formed by thermal growth, ALD, CVD, HDP-CVD, PVD, and/or other suitable deposition processes. The hard mask may include other suitable material, such as a silicon oxide layer and a poly-silicon layer on the silicon oxide layer.

Figure 3:
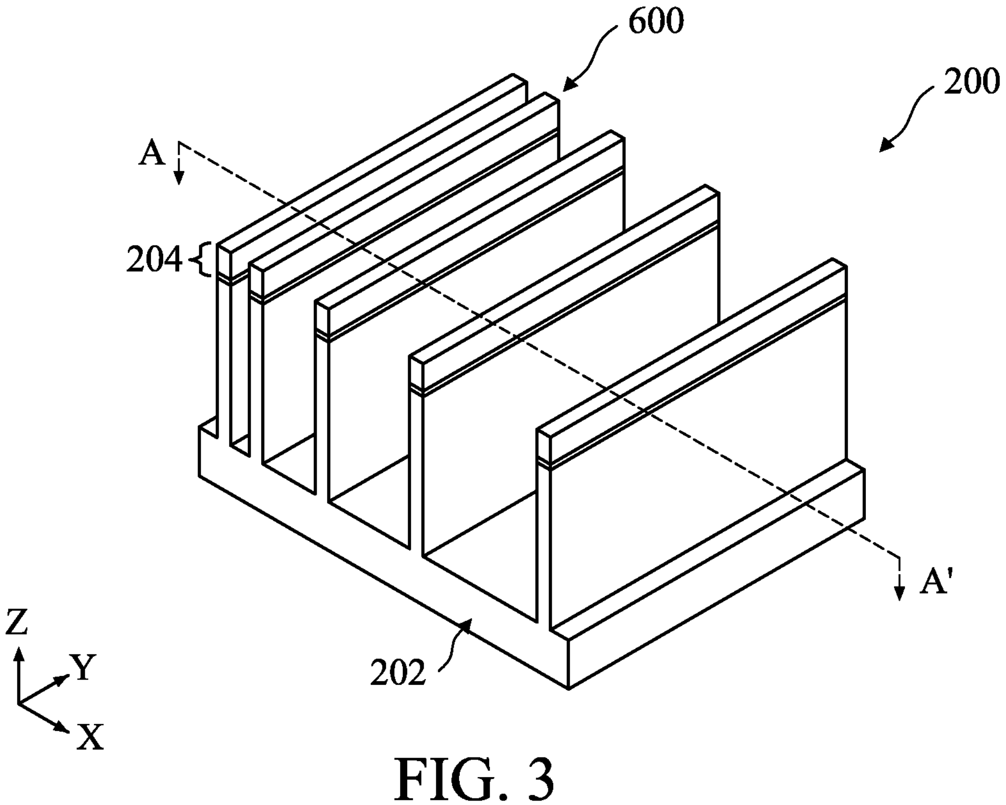
FIG. 3 is a perspective view of the semiconductor structure at a further fabrication stage, in accordance with some embodiments.
Figure 4:
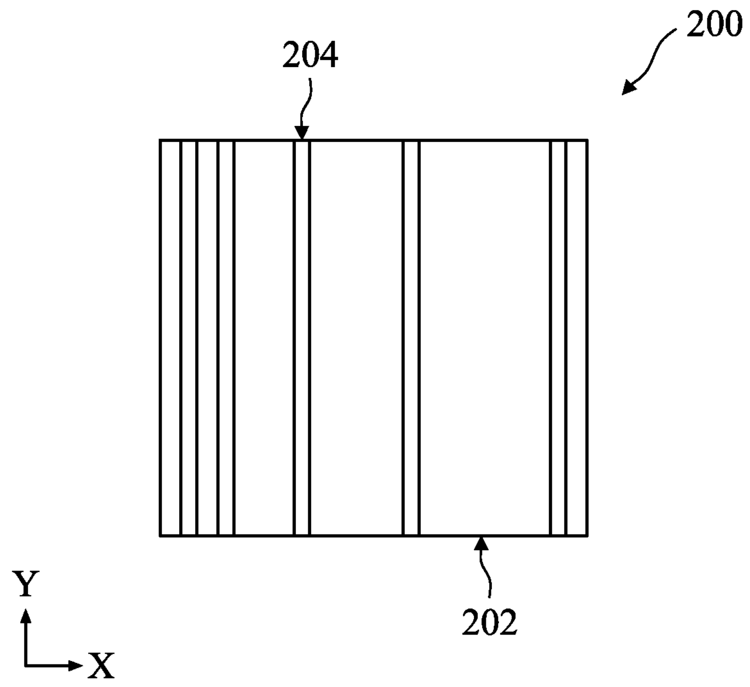
FIG. 4 is a top view of the semiconductor structure of FIG. 3.
Figure 5:
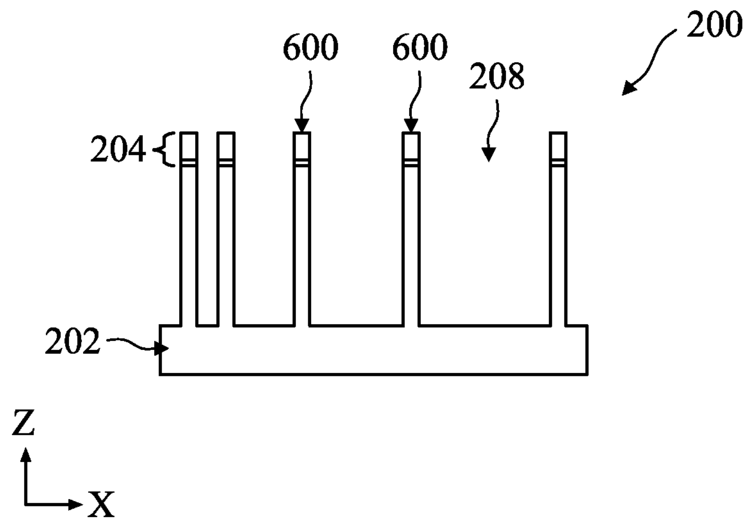
FIG. 5 is a cross-sectional view of the semiconductor structure of FIG. 3, taken along line A-A'.

Cross-referencing FIG. 1 and FIG. 3, operation S102 may further include patterning the substrate 202 to form one or more device fin bases 600 extending from the substrate 202. FIG. 4 is a top view of the semiconductor structure 200 of FIG. 3; and FIG. 5 is a sectional view of the semiconductor structure 200 of FIG. 3, taken along line A-A'.

In some embodiments, operation S102 includes lithography process and etching. In furtherance of the embodiments, the operation S102 includes forming a patterned photoresist (or resist) layer by a lithography process and etching to form trenches and a fin structure using the patterned resist layer as an etch mask. In the present embodiment, the openings in the patterned resist layer are first transferred to the hard mask 204 by a first etching and then are transferred to the substrate 202 by a second etching. More details of the operation S102 are further provided below.

A resist used to define the fin structure 600 may be formed on the hard mask layer 204. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning or lithography process.

In one embodiment, the resist layer is patterned to leave the portions of the photoresist material disposed over the semiconductor structure 200 by the lithography process. After patterning the resist, an etching process is performed on the semiconductor structure 200 to open the hard mask layer 204, thereby transferring the pattern from the resist layer to the hard mask layer 204. The remaining resist layer may be removed after the patterning the hard mask layer 204. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The first etching process applied to the hard mask 204 may include multiple etching steps. For example, the silicon oxide film in the hard mask layer may be etched by a diluted hydrofluorine solution and the silicon nitride film in the hard mask layer may be etched by a phosphoric acid solution. The second etching process applied to the substrate 202 may include any suitable etching technique such as dry etching, wet etching, other etching methods (e.g., reactive ion etching (RIE)), or a combination thereof. In some examples, the second etching process may include multiple etching steps with different etching chemistries, each targeting a particular material of the semiconductor structure 200. In some examples, the semiconductor material of the substrate may be etched by a dry etching process using a fluorine-based etchant. In some embodiments, etching includes multiple etching steps with different etching chemistries, each targeting a particular material of the substrate 202 and each selected to resist etching the hard mask 204. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become the device fin bases 600, defining the trenches 208 between the device fin bases 600.

The etching processes are designed to produce fin bases 600 of any suitable height and width extending from the substrate 202. Particularly, the etching process applied to the substrate 202 is controlled such that the substrate 202 is partially etched, as illustrated in FIG. 3. This may be achieved by controlling etching time or by controlling other etching parameter(s). By the etching processes, the fin array is formed and extends from the substrate 202. The fin array includes a plurality of elongated fin-like active regions (simply fins) extending in the Y-direction and spaced apart from one another in the X-direction. In addition to defining the fin bases 600, the etching process also define one or more isolation trenches 208 between the active regions of the fin bases 600. The fin active regions of the fin bases may be referred to as device fins, to differentiate from fill fins that may be introduced later. As illustrated from the above description, the device fin bases 600 may include the same semiconductor material as substrate 202 or may include one or more semiconductor materials same or different form that of the substrate 202. For example, the device fin bases 600 include silicon, germanium, silicon germanium, or other suitable semiconductor material.

Figure 6:
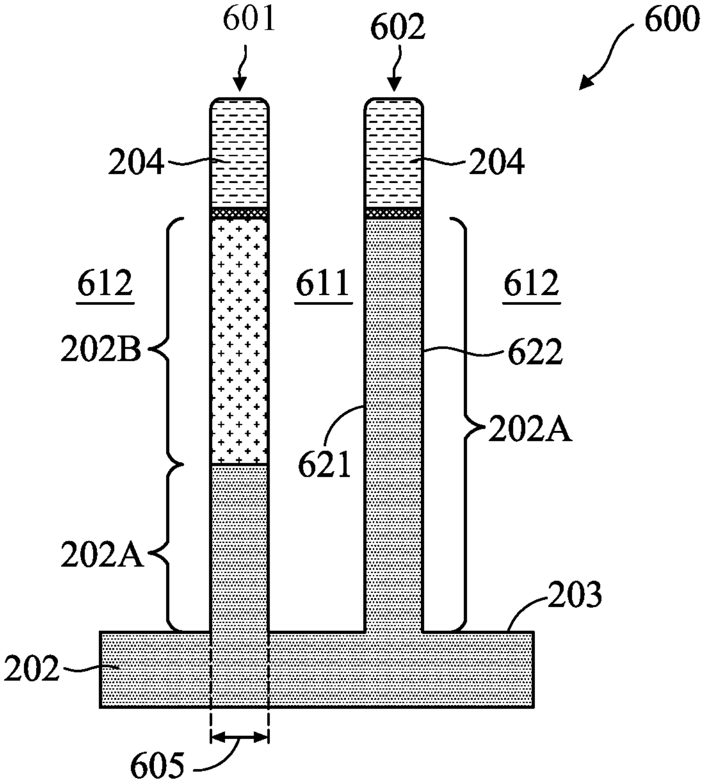
FIGS. 6-12 are focused views of two fin structures of the semiconductor structure of FIG. 5, at further fabrication stages, in accordance with some embodiments.

Referring now to FIG. 6, an enlarged view of two fin bases 600, specifically fin base 601 and fin base 602, is provided for clarity of discussion. As shown in FIG. 6, exemplary operation S102 may result in forming a fin base 601 that includes a first or proximal or lower portion 202A, formed from a first material, and a second or distal or upper portion 202B, formed from a second material. In an exemplary embodiment, lower portion 202A is silicon (Si) and upper portion 202B is silicon germanium (SiGe). Further, exemplary operation S102 may result in forming an fin base 602 that is formed only from a first material, such that fin base 602 consists of portion 202A.

As shown in FIG. 6, each fin base 600 extends upward from a surface 203 of the unetched substrate 202. Further, each fin base 600 is formed with a thickness 605 in the X-direction. Due to the difficulty in etching at a high aspect ratio, the thickness 605 may be more variable than is desired.

As further shown, the closest structure each fin base 601 and 602 is located to is the adjacent fin base 602 and 601, with a narrow or tight gap 611 therebetween. For example, a narrow or tight gap 611 may have a width in the X-direction of less than 2 nanometers (nm). Each fin base 601 and 602 is spaced more distantly from any other fins or structures (not shown) by large or open gaps 612. Further each fin base 601 and 602 has a sidewall 621 facing the tight gap 611 and an opposite sidewall facing the open gap 612. The sidewall 621 facing the tight gap 611 may be referred to as a tight sidewall and the sidewall 622 facing the open gap 612 may be referred to as an open sidewall 622. These terms do not refer to any structural feature of the sidewalls 621 and 622, rather the terms simply refer to the relationship of each sidewall 621 or 622 to the adjacent gap 611 or 612.

Figure 7:
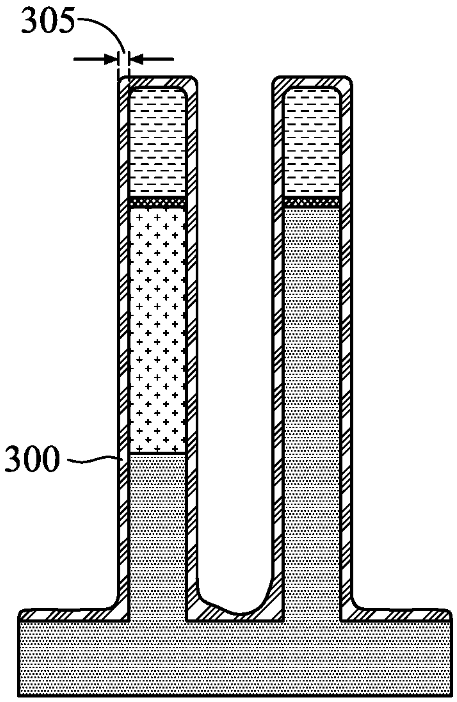

Referring to FIG. 1 and FIG. 7, method 100 continues with forming a layer of additional material 300 over each fin base 601 and 602 at operation S104. The additional material 300 will join the fin base to form a fin structure, thus, the additional material 300 may be considered to be additional fin material.

In an exemplary embodiment, the additional material 300 is semiconductor material. An exemplary layer of additional material 300 comprises silicon. The silicon layer 300 may be formed, for example, by using a deposition technique that can form a conformal silicon layer, such as the low temperature chemical vapor deposition process (CVD) in a gaseous environment containing $Si_3H_8$, $SiH_4$, $SiCl_2H_2$, $SiCl_3H$, or a combination thereof.

In some embodiments, the gas environment also comprises a carrier gas such as $H_2$. The carrier gas helps to better control treatment uniformity. A temperature for the formation of the silicon layer 300 in the chemical deposition process is in a range of about 250° C. to 550° C., in some embodiments.

As shown in FIG. 7, the layer 300 has a thickness 305.

As shown in FIG. 7, the layer 300 is deposited over the fin bases 601 and 602 and along sidewalls 621 and 622 as wells as over the surface 203.

As shown in FIG. 1, method 100 continues with adjusting the thickness of the additional layer 300 at operation S110. For example, operation S110 may include reducing the thickness of the additional layer 300 at certain locations.

Figure 8:
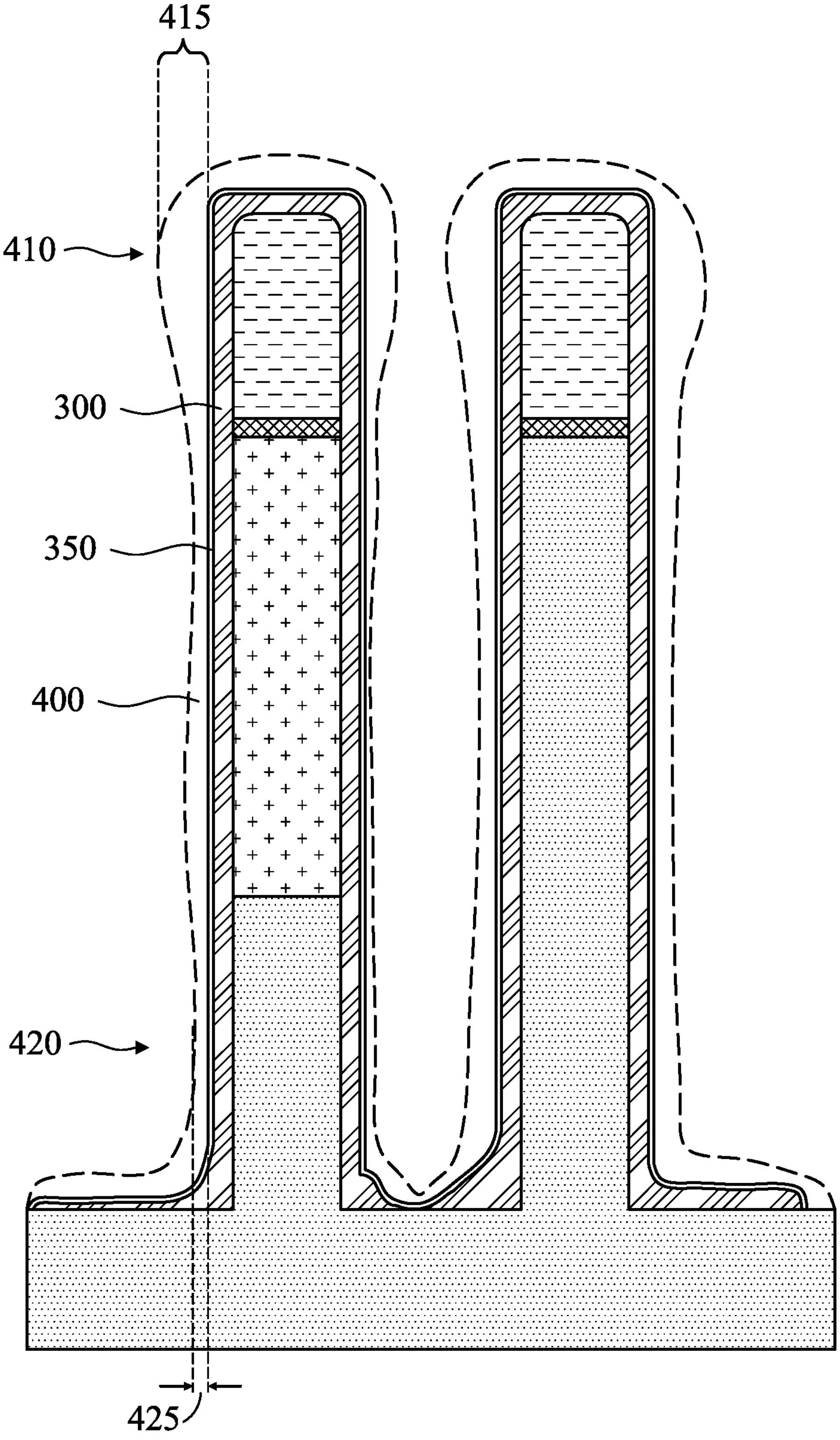

In certain embodiments, operation S110 is performed by first forming a second layer 400 over the additional layer 300 at operation S112. Deposition of the second layer 400 over the additional layer 300 is illustrated in FIG. 8. As shown, the second layer 400 contacts the additional layer 300 at an interface 350.

In an exemplary embodiment, the second layer 400 comprises silicon oxide. The second layer 400 may be deposited by any suitable technique including thermal growth, CVD, HDP-CVD, PVD, ALD, and/or spin-on techniques. In an exemplary embodiment, the second layer 400 is formed by plasma-enhanced atomic layer deposition (PEALD).

Due to the high aspect ratio, deposition of the layer 400 along the sidewalls 621 and 622 may result in loading, i.e., the layer 400 may be formed with a greater thickness, such as thickness 415, at an upper portion 410 of the layer 400 near the upper end of the fin bases 601 and 602, and with a smaller thickness, such as thickness 425, at a lower portion 420 near the lower end of the fin bases 601 and 602. This effect may be exacerbated on the tight sidewalls 621 as compared to the open sidewalls 622.

As shown in FIG. 1, operation S110 further includes operation S114, which includes performing a thermal anneal process. An exemplary thermal anneal process is performed with oxygen and nitrogen gas. In an exemplary embodiment, the thermal anneal process is a rapid thermal anneal (RTA) process.

In an exemplary embodiment, during the thermal anneal process, silicon from the additional layer 300 is consumed at the interface 350 of the additional layer 300 and the second layer 400 by oxygen radicals to form silicon oxide, i.e., the outer surface of the additional layer 300 is oxidized. Thus, the thickness of the additional layer 300 is reduced, at least in certain regions.

It is contemplated that the oxidation profile of the additional layer 300 can be tuned by controlling the thermal anneal ambient.

In certain embodiments, the thermal anneal process reaches a desired elevated temperature and maintains the desired elevated temperature for a duration or soak time to cause consumption or oxidation of a desired amount of the additional layer 300. Specifically, the longer the soak time, the greater amount of additional layer 300 is consumed.

Figure 9:
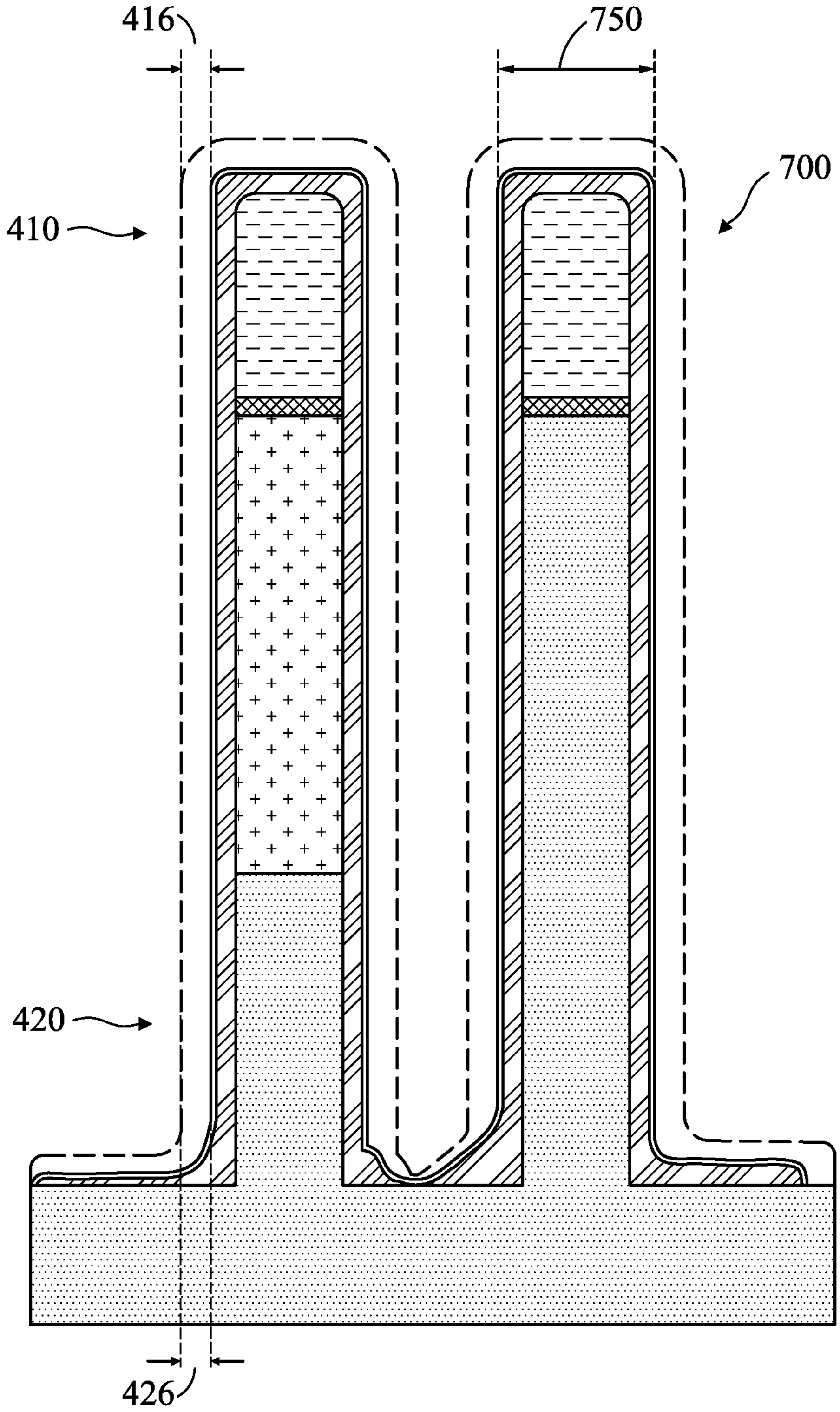

During the thermal anneal process, conversion of silicon to silicon oxide may improve conformality and reduce loading in the second layer 400. Specifically, the newly converted silicon oxide may be considered to be part of the second layer 400. In regions where the second layer 400 is thin, such as at lower region 420 of the second layer 400, more oxygen reaches the additional layer 300 at the interface, as compared to regions where the second layer 400 is thick, such as at upper region 410 of the second layer. Therefore, more silicon is converted to silicon oxide at the interface 350 adjacent to lower region 420 as compared to the interface 350 adjacent to upper region 410. As a result, the thickness at thin regions is increased relative to thicker regions, thereby reducing loading. As shown in FIG. 9, after the thermal anneal process the lower region 420 has a thickness 426 that is closer to the thickness 416 of upper region 410.

The process described above uses a fixed thickness of the second layer 400 and adjusts the soak time to consume or convert a desired amount of the additional layer 300. In other embodiments, a constant soak time may be used in conjunction with a second layer 400 having a variable thickness. For example, the second layer 400 may be formed as a split layer with two (or more) different thicknesses. For example, regions of the second layer 400 with a thinner thickness may be formed at desired locations and regions of the second layer 400 with a thicker thickness may be formed at other locations. Then, the thermal anneal process may be performed for a constant soak time. As a result, desired silicon consumption may be obtained at focused locations.

Further, during the thermal anneal process, the quality of the second layer 400 may be improved. For example, sub-oxide may be present in the second layer, such as at the interface between the additional layer and second layer. The thermal process may repair the sub-oxide, such as by oxygen radical repair.

Also, the second layer may be formed with a porous structure. The thermal treatment may reduce the porosity of the structure and improve density, such as through densification. For example, the thermal treatment may be performed with a gas composition including nitrogen and nitridation may reduce the porosity of the structure of the second layer.

In certain embodiments, the oxide tapping profile can be improved by oxygen radical annealing.

After performing the thermal anneal process, a fin structure 700, including a respective fin base and the additional layer thereon, is formed with a desired critical dimension 750.

Figure 10:
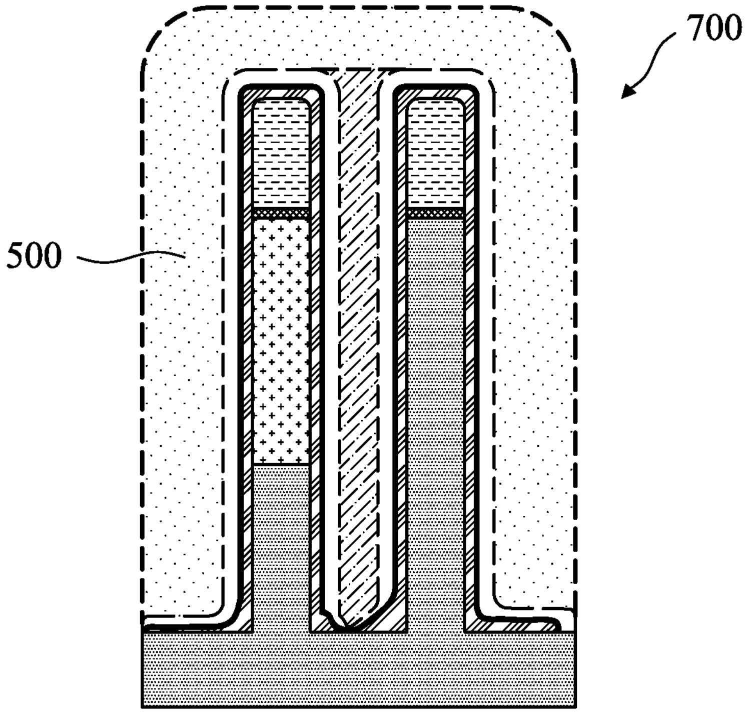

Referring now to FIG. 1, method 100 may continue with further processing to form the desired device at operation S120. For example, as shown in FIG. 10, an insulation material 500 may be deposited over the fin structures 700. An exemplary insulation material 500 is silicon oxide. The insulation material 500 may be considered to be STI oxide.

Figure 11:
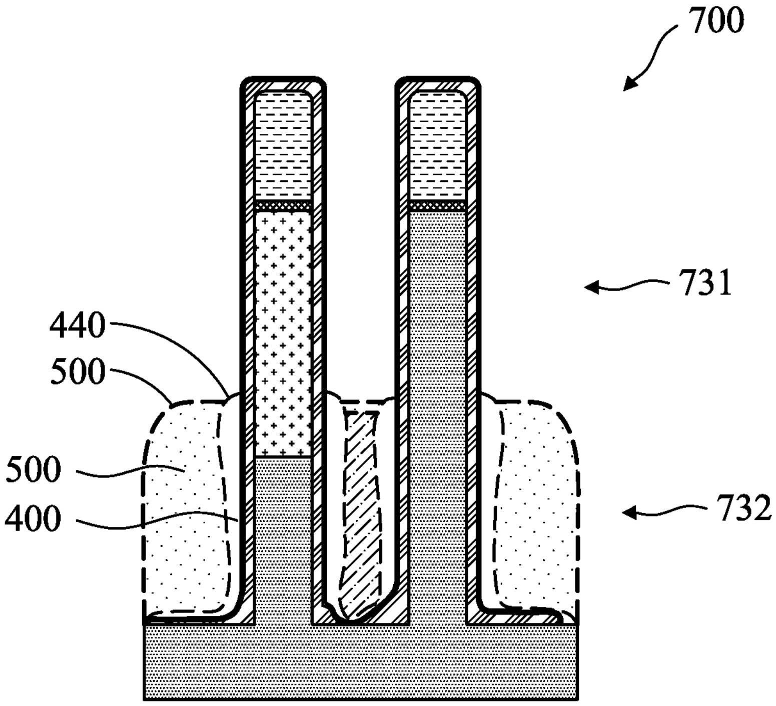

Operation S120 may further include recessing the insulation material 500, as shown in FIG. 11. Further, as shown, operation S120 may also recess the second layer 400. For example, insulation material 500 may be recessed to surface 540 and second layer 400 may be recessed to surface 440. As a result, an upper portion 731 of the fin structure 700 is uncovered while a lower portion 732 remains surrounded by the remaining second layer 400 and the insulation material 500 around the second layer 400.

Figure 12:
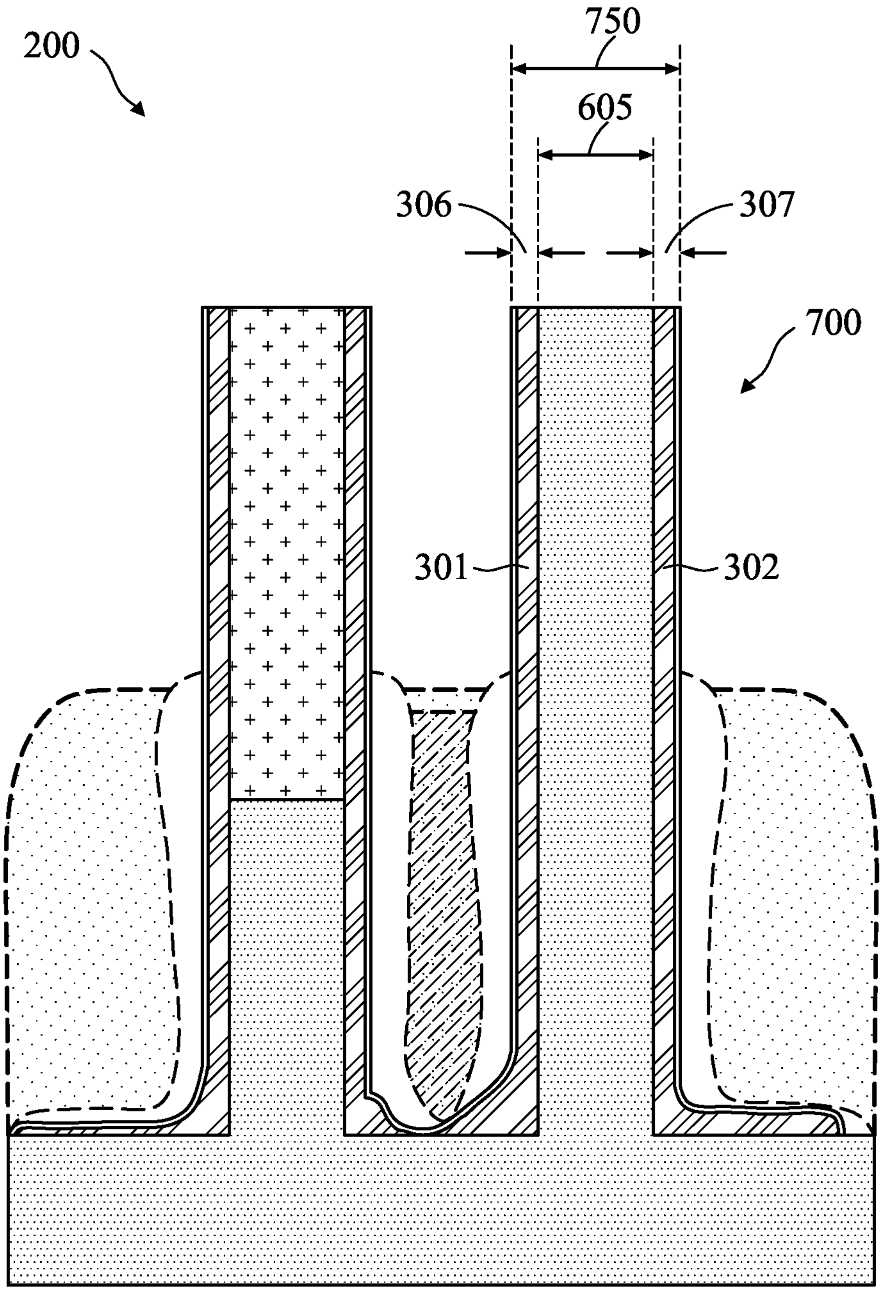

Operation S120 may also include a planarization process such as a chemical mechanic planarization (CMP) process to remove the hard mask and to planarize the top surface of the fin structures 700, as shown in FIG. 12.

In FIG. 12, it may be seen that each fin structure has a critical dimension 750 that is equal to the sum of the thickness 605 of the fin base (defined between the sidewalls of the fin base), the adjusted thickness 306 of the additional layer segment 301 on the tight sidewall, and the adjusted thickness 307 of the additional layer segment 302 on the open sidewall.

The additional layer segments 301 and 302 may be added to obtain a total outer layer thickness. In certain embodiments, the ratio of the thickness 605 to the total outer layer thickness may be at least 1:1, such as at least 2:1, at least 3:1, at least 4:1, at least 5:1, at least 6:1, at least 7:1, at least 8:1, or at least 9:1; and may be no more than 10:1, such as no more than 9:1, no more than 8:1, no more than 7:1, no more than 6:1, no more than 5:1, no more than 4:1, no more than 3:1, or no more than 2:1.

The fin base may be considered to form a central structure that is laterally surrounded by the additional layer as an outer semiconductor liner.

Operation S120 may further include a trench cut process to define the ends of the fin structures, a sacrificial gate formation process and a replacement gate process to form gates over the fin structures, source/drain region formation, and formation of various dielectric and conductive layers.

A method is provided in accordance with some embodiments. The method includes forming an initial fin having a sidewall; forming an additional layer of fin material over the sidewall, wherein the additional layer has a thickness; and adjusting the thickness of the additional layer of fin material to form a fin structure with a desired critical dimension.

In certain embodiments of the method, the initial fin comprises silicon or comprises a first portion of silicon and a second portion of silicon germanium; and the additional layer of fin material comprises silicon.

In certain embodiments of the method, adjusting the thickness of the additional layer of fin material to form the fin structure with the desired critical dimension includes forming a second layer over the additional layer of fin material; and performing a thermal anneal process to reduce the thickness of the additional layer of fin material.

In certain embodiments of the method, the initial fin comprises silicon or comprises a first portion of silicon and a second portion of silicon germanium; the additional layer of fin material comprises silicon; and the second layer comprises silicon oxide.

In certain embodiments of the method, the second layer contacts the additional layer of fin material at an interface; and performing the thermal anneal process comprises consuming silicon at the interface and growing silicon oxide at the interface.

In certain embodiments of the method, the second layer is silicon oxide; and performing the thermal anneal process comprises repairing sub-oxide in the second layer.

In certain embodiments of the method, the second layer is silicon oxide; and performing the thermal anneal process comprises densifying the silicon oxide.

In certain embodiments of the method, the second layer includes a first region with a thinner thickness and a second region with a thicker thickness greater than the thinner thickness; and performing the thermal anneal process comprises thickening the second layer in the first region relative to the second region to reduce a thickness differential of the second layer.

In certain embodiments, the method further includes removing the second layer from an upper portion of the fin structure, wherein the second layer remains laterally adjacent to a lower portion of the fin structure.

In certain embodiments, the method further includes determining a desired adjustment to the thickness of the additional layer of fin material; and performing the thermal anneal process for a duration of time effective to obtain the desired adjustment to the thickness of the additional layer of fin material.

In certain embodiments of the method, the second layer is formed with different thicknesses at different regions such that the thermal anneal process selectively reduces the thickness of the additional layer of material.

In certain embodiments of the method, the initial fin has an initial thickness and has two sidewalls including a tight sidewall and an open sidewall, wherein the tight sidewall is adjacent to a nearby fin; forming the additional layer of fin material over the sidewall comprises forming the additional layer of fin material over both sidewalls, wherein the additional layer has a first thickness over the tight sidewall and the additional layer has a second thickness over the open sidewall; and adjusting the thickness of the additional layer of fin material to form the fin structure with the desired critical dimension comprises adjusting the first thickness and the second thickness, wherein the desired critical dimension equals the sum of the first thickness, the second thickness, and the initial thickness.

A method is provided in accordance with other embodiments. The method includes forming a layer of semiconductor material over a surface; forming a layer of insulating material over the layer of semiconductor material, wherein the layer of insulating material comprises a first region with a thinner thickness and a second region with a thicker thickness greater than the thinner thickness; and performing a thermal anneal process to reduce the thickness of the layer of semiconductor material and to reduce a difference between the thinner thickness and the thicker thickness of the insulating material.

In certain embodiments of the method, an interface is defined between the layer of semiconductor material and the layer of insulating material; and performing the thermal anneal process comprises consuming semiconductor material at the interface and growing insulating material at the interface.

In certain embodiments of the method, the semiconductor material is silicon, the insulating material is silicon oxide, and the thermal anneal process is performed with oxygen and nitrogen.

A device is provided in accordance with certain embodiments. The device includes a fin over a substrate, wherein the fin comprises a central structure and an outer semiconductor liner laterally surrounding the central structure.

In certain embodiments, the fin has an upper distal portion and a lower portion located between the upper distal portion and the substrate, and the device further includes an insulating layer laterally surrounding the lower portion of the fin.

In certain embodiments of the device, the central structure of the fin includes a first segment and a second segment, wherein the first segment and the second segment are comprised of different materials.

In certain embodiments of the device, the central structure of the fin includes a first segment comprised of silicon; the central structure of the fin includes a second segment comprised of silicon germanium; the second segment lies over the first segment; and the outer semiconductor liner is comprises of silicon.

In certain embodiments of the device, the central structure has a central thickness in a lateral direction defined between a first sidewall and a second sidewall; the outer semiconductor liner comprises a first segment adjacent the first sidewall and a second segment adjacent the second sidewall; the first segment has a first thickness in the lateral direction; the second segment has a second thickness in the lateral direction; the outer semiconductor liner has an outer thickness equal to a sum of the first thickness and the second thickness; and the ratio of the central thickness to the outer thickness is from 1:1 to 10:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method, comprising:
forming a fin having a sidewall;
forming an additional layer of fin material over the sidewall, wherein the additional layer has an initial thickness greater than a desired thickness;
forming a second layer over the additional layer of fin material, wherein the second layer has a first region with a thinner thickness and a second region with a thicker thickness greater than the thinner thickness; and
reducing the initial thickness of the additional layer of fin material through controlled oxidation comprising thickening the second layer in the first region relative to the second region to reduce a thickness differential of the second layer to form a fin structure with the desired thickness.

2. The method of claim 1, wherein:
the fin comprises silicon or comprises a first portion of silicon and a second portion of silicon germanium; and
the additional layer of fin material comprises silicon.

3. The method of claim 1, wherein reducing the initial thickness of the additional layer of fin material to form the fin structure with the desired thickness comprises performing a thermal anneal process to reduce the initial thickness of the additional layer of fin material.

4. The method of claim 3, wherein:
the fin comprises silicon or comprises a first portion of silicon and a second portion of silicon germanium;
the additional layer of fin material comprises silicon; and
the second layer comprises silicon oxide.

5. The method of claim 3, wherein:
the second layer contacts the additional layer of fin material at an interface; and
performing the thermal anneal process comprises consuming silicon at the interface and growing silicon oxide at the interface.

6. The method of claim 3, wherein:
the second layer comprises silicon oxide; and
performing the thermal anneal process comprises repairing sub-oxide in the second layer.

7. The method of claim 3, wherein:
the second layer comprises silicon oxide; and
performing the thermal anneal process comprises densifying the silicon oxide.

8. The method of claim 3, further comprising removing the second layer from an upper portion of the fin structure, wherein the second layer remains laterally adjacent to a lower portion of the fin structure.

9. The method of claim 3, further comprising:
determining a desired adjustment to the thickness of the additional layer of fin material; and
performing the thermal anneal process for a duration of time effective to obtain the desired adjustment to the thickness of the additional layer of fin material.

10. The method of claim 3, wherein the second layer is formed with different thicknesses at different regions such that the thermal anneal process selectively reduces the thickness of the additional layer of fin material.

11. A method, comprising:
forming a semiconductor structure having a sidewall;
forming an additional layer of semiconductor material over the sidewall, wherein the additional layer has an initial thickness;
forming a second layer over the additional layer, wherein the second layer has a first region with a thinner thickness and a second region with a thicker thickness greater than the thinner thickness; and
adjusting the initial thickness of the additional layer of semiconductor material to form a combined structure with a desired thickness, wherein adjusting the thickness of the additional layer of semiconductor material comprises:
determining an amount of the additional layer to be consumed; and
performing a controlled oxidation for a duration selected based on the amount of the additional layer to be consumed, wherein performing the controlled oxidation comprises thickening the second layer in the first region relative to the second region to reduce a thickness differential of the second layer.

12. The method of claim 11, wherein performing controlled oxidation comprises performing a thermal anneal process with a gas composition including oxygen and nitrogen to oxidize a portion of the additional layer.

13. The method of claim 11, further comprising, after adjusting the initial thickness of the additional layer, depositing an insulation material over the combined structure to form a shallow trench isolation feature.

14. The method of claim 11, wherein adjusting the initial thickness of the additional layer of semiconductor material comprises performing a thermal anneal process to reduce the thickness of the additional layer via the controlled oxidation.

15. The method of claim 11, further comprising, after adjusting the thickness of the additional layer, performing a chemical mechanical planarization process to planarize a top surface of the combined structure.

16. A method, comprising:

forming a semiconductor device element having a sidewall;

forming an additional layer of material over the element;

forming a second layer over the additional layer, wherein the second layer has a thin portion with a first initial thickness and a thick portion with a second initial thickness greater than the first initial thickness; and performing a process to reduce a thickness differential between the thin portion and the thick portion, wherein performing the process comprises thickening the thin portion to a first thickness greater than the first initial thickness.

17. The method of claim 16, wherein the process further comprises thinning the additional layer of material to a reduced thickness.

18. The method of claim 16, wherein:

the semiconductor device element is a semiconductor fin comprising silicon or comprising a first portion of silicon and a second portion of silicon germanium;

the additional layer of material comprises silicon; and the second layer comprises oxide.

* * * * *